US012571830B2

(12) United States Patent
Bussy et al.

(10) Patent No.: US 12,571,830 B2
(45) Date of Patent: Mar. 10, 2026

(54) DETECTION OF ELECTRIC ARCS IN AN ELECTRICAL SYSTEM

(71) Applicant: SAFRAN ELECTRICAL & POWER, Blagnac (FR)

(72) Inventors: Emmanuel Bussy, Moissy-Cramayel (FR); Sylvain Poignant, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 613 days.

(21) Appl. No.: 17/773,524

(22) PCT Filed: Oct. 26, 2020

(86) PCT No.: PCT/FR2020/051930
§ 371 (c)(1),
(2) Date: Aug. 16, 2022

(87) PCT Pub. No.: WO2021/084196
PCT Pub. Date: May 6, 2021

(65) Prior Publication Data
US 2022/0381811 A1 Dec. 1, 2022

(30) Foreign Application Priority Data
Oct. 30, 2019 (FR) ...................................... 1912201

(51) Int. Cl.
*G01R 31/11* (2006.01)
*H02H 1/00* (2006.01)
(52) U.S. Cl.
CPC ........... *G01R 31/11* (2013.01); *H02H 1/0015* (2013.01)

(58) Field of Classification Search
CPC .............................. G01R 31/11; H02H 1/0015
See application file for complete search history.

(56) References Cited

U.S. PATENT DOCUMENTS

| | | | | |
|---|---|---|---|---|
| 5,185,684 A | * | 2/1993 | Beihoff | G01R 15/181 |
| | | | | 361/87 |
| 5,839,092 A | * | 11/1998 | Erger | G01R 31/52 |
| | | | | 702/58 |
| 2004/0183544 A1 | * | 9/2004 | Allan | G01R 31/58 |
| | | | | 324/533 |
| 2005/0057869 A1 | * | 3/2005 | Hale | H02H 1/0015 |
| | | | | 361/64 |
| 2016/0276820 A1 | * | 9/2016 | Olivas | H02H 1/0061 |
| 2017/0010314 A1 | * | 1/2017 | Drost | G01R 31/008 |

OTHER PUBLICATIONS

International Search Report mailed on Mar. 3, 2021, issued in International corresponding Application No. PCT/FR2020/051930, filed Oct. 26, 2020, 5 pages.
Written Opinion mailed on Mar. 3, 2021, issued in International corresponding Application No. PCT/FR2020/051930, filed Oct. 26, 2020, 4 pages.

* cited by examiner

Primary Examiner — Lisa M Caputo
Assistant Examiner — Sharah Zaab
(74) Attorney, Agent, or Firm — CHRISTENSEN O'CONNOR JOHNSON KINDNESS PLLC

(57) ABSTRACT

A method for detecting an electrical arc in an electrical system including analyzing a reflectogram representative of a spatial distribution of impedance in said electrical system and, when an electric arc is identified in the reflectogram, incrementing a detection counter by one unit.

17 Claims, 4 Drawing Sheets

DETECTION OF ELECTRIC ARCS IN AN ELECTRICAL SYSTEM

CROSS-REFERENCES TO RELATED APPLICATIONS

This application is a National Stage of International Application No. PCT/FR2020/051930 filed Oct. 26, 2020, which claims priority to French Patent Application No. 1912201, filed Oct. 30, 2019, the entire disclosures of which are hereby incorporated by reference.

TECHNICAL FIELD OF THE INVENTION

The invention relates to the field of the electric arc detection by reflectometry in electrical systems and relates, in particular, to a method for detecting such an arc. The invention also relates to a processing unit and a detection system adapted to implement the steps of the detection method.

TECHNICAL BACKGROUND

The prior art comprises, but is not limited to, the documents US-A1-2016/276820, US-A1-2017/010314 and US-A1-2004-183544.

Detecting the presence of electric arcs in an aviation environment is an important issue for the current and future aircraft electrical systems. Indeed, an electric arc can be a source of disturbance to the operation of an electrical system or even of deterioration of the system or its environment. In addition, the increase in on-board power levels leads to an increase in wiring density and therefore the risk of electric arcs.

On the current systems, the danger of electric arcs can be controlled by the design of the EWIS (Electrical Wiring Interconnection System) materials and the so-called segregation distances between the different cables. Indeed, these systems can be composed, on the one hand, of AC voltage systems (e.g. 115/230 $V_{ac}$) for which the voltage changes at 0 volt favor the extinction of arcs and, on the other hand, of DC voltage systems (e.g. 28 $V_{dc}$) for which the transported power minimizes the appearance and the danger of electric arcs that may appear.

On the potential future systems, the increase in the voltage levels used and/or the choice of switching to a DC voltage would significantly increase the risk of electric arcs. Furthermore, for systems using voltages greater than or equal to 270 $V_{dc}$, it will be complicated to validate the cable resistance standards against electric arcs (i.e., the EN_3475_604 and EN_3475_605 standards) without adding an efficient active detection system, notably because of the continuous character of the voltage.

A well-known approach used for the detection of electric arcs in an electrical system is the reflectometry. This method allows not only the detection of the presence of an electric arc but also their localization in the system. In particular, this method allows to obtain reflectograms representative of the spatial distribution of the impedance in the characterized electrical system. A local disturbance/modification of the impedance linked to the presence of an electric arc can thus be detected and localized by comparison with a reflectogram free of any disturbance. However, the reliability of this method can be impacted by the characteristics of an arc and/or the system on which it appears.

In particular, the electric arcs that can appear on an electrical system can be classified into 4 main types which are the combination of the following properties:

an arc in parallel or an arc in series; and, an arc appearing on an alternating voltage (AC) system or an arc appearing on a direct voltage (DC) system.

An universal arc detection system should therefore ideally be able to characterize an electrical system where each of these 4 types of arcs potentially occurs. However, each type of arc has its own characterization difficulties. Either directly because of the functions of the system, or because of intrinsic parameters of the electric arc. In addition, some specific characteristics of arcs make it difficult to characterize them accurately by reflectometry.

First, the impedance of an electric arc is very low. This is a definite advantage for the detection of an arc in parallel (regardless of the type of DC or AC system). On the other hand, it is a disadvantage for the detection of an arc in series. Indeed, the addition of a small impedance in series on the system only slightly modifies the characteristics of said system and the small change in impedance due to the presence of a series arc may not be detected.

For example, measurements performed in the laboratory with a parallel arc and a series arc, respectively, having the same voltage/current characteristics have shown a difference of a factor of 8 between the amplitude variation of the fault peak on the reflectogram related to the parallel arc fault compared to that related to the series arc fault.

Secondly, the EMI (ElectroMagnetic Interference) noise generated by the arc can disturb the measurements. Indeed, the generation of an electric arc on an electrical system is systematically accompanied by electromagnetic disturbances conducted over a wide frequency band. Indeed, the current flowing through an electric arc is generally intense and variable. This is why an electric arc causes strong electromagnetic disturbances which can be translated into noise on the reflectogram for a detection system by reflectometry. If the level of this noise exceeds the detection thresholds, the consequences are, on the one hand, the fact that the system is not able to locate the defect and, on the other hand, the risk of a "false positive" arc detection, i.e., the assimilation of a noise to an arc. Indeed, if such an electromagnetic noise disturbs the measurements during an arc diagnosis, the system may not be robust in the environmental tests that must be passed during the qualification of an electrical system in order to make it "airworthy" (i.e. compatible with the requirements inherent to its operation in an aircraft). In other words, the existence of a false positive can lead to unfounded maintenance operations and unnecessarily decrease the availability of an aircraft.

FIGS. 1a and 1b respectively illustrate examples of reflectograms representative of a spatial distribution of impedance in an electrical system. The person skilled in the art will appreciate that, in a manner known per se, the abscissa represented in time can be easily converted into a position in the electrical system.

FIG. 1a represents a case of serial arc detection not impacted by electromagnetic noise. In a case where the specifier seeks to obtain a very fast detection and thus define very low detection thresholds, this case represents about 10% of the population of reflectograms acquired by a reflectometry detection system during a serial arc diagnosis. The "signature" of the arc in the reflectogram is easily identified by the reflectogram amplitude exceeding a predetermined threshold 101 at a given point 102. In contrast, FIG. 1b shows another reflectogram impacted by electromagnetic noise. Under the same test conditions, this case represents 90% of the population of reflectograms acquired by a reflectometry detection system during a serial arc diagnosis. The selected predetermined threshold 101 for determining the presence of an arc is exceeded at many points 103 due to the presence of significant noise in the measurement signal. Although the presence of noise helps to confirm the actual presence of an arc, it also allows to reliably locate it in the system and may further mislead the system as to the actual number of arcs actually present.

Finally, as mentioned earlier, a series arc is more complicated to detect than a parallel arc. Moreover, in the case of a series arc in an AC voltage system, the return to 0 Volt at each half-period is an opportunity for the electrical circuit to be in open circuit for a few tens to hundreds of microseconds. This duration depends on the distance between the electrodes and the voltage and frequency values of the system. If necessary, from the point of view of the reflectogram, the open circuit adds an impedance close to infinity (open circuit), which favors its diagnosis by bringing out the impedance mismatch peak of the noise. On the other hand, in the case of an arc in series on a DC voltage system, the absence of a return to 0 Volt significantly reduces (or even completely eliminates) these small open circuits. Under these conditions, only the arc impedance remains. Only the presence of this arc impedance in the reflectogram can be used to detect it.

The combination of the 3 characteristics described above results in two major problems:

detecting a series arc in a DC system is systematic but often provides a reflectogram from the EMI noise inherent to the arc and therefore does not allow a reliable localization.

a reflectogram impacted by EMI noise can also be impacted by environmental noise. In other words, such a detection system is limited in terms of robustness to the measurement conditions.

It is known a system for detecting faults in electrical systems using a protection system using reflectometry. The system allows the detection and analysis of impedance changes in the electrical system. In addition, it aims to improve the detection time and offers a good compromise between detection quality and false alarms. However, this system is not specific to the detection of electric arcs.

It is also known different methods and devices for electric line diagnosis based on the reflectometry, and in particular the MCTDR method (for "MultiCarrier Time Domain Reflectometry") as well as a device integrating this technology.

Finally, the known approaches of the prior art do not allow to reliably detect (i.e., with or without noise and without false detection) series arcs in an electrical system.

SUMMARY OF THE INVENTION

The present invention proposes a method for confirming the detection of an electric arc in an electrical system in a reliable and robust manner even when the measurements are disturbed by electromagnetic noise.

To this end, according to a first aspect, the invention relates to a method for detecting an electric arc in an electrical system, said method comprising the following steps, performed by a processing unit:

a) analyzing a reflectogram representative of a spatial distribution of impedance in said electrical system and, if an electric arc is identified in the reflectogram, incrementing a detection counter by one unit;

b) comparing the value of the detection counter with a first determined value, preferably equal to the unit, if the value of the detection counter is equal to the first determined value, c) storing, in a memory, a value representative of the position in the electrical system of the identified arc, otherwise, d) comparing a value representative of the position in the electrical system of the identified electric arc with a determined value interval, said value interval preferably being equal to a value representative of the position stored in memory of an identified electric arc plus or minus a second determined value, if the value representative of the position of the identified electric arc in the electrical system is not included in the determined value interval, e) storing a third determined value of detection counter in the memory, otherwise, f) comparing the value of the detection counter with a fourth determined value and, if the value of the detection counter is equal to the fourth determined value, generating diagnostic information representative of the presence of an electric arc.

The method according to the invention may include one or more of the following features, taken alone or in combination with each other:

step e) consists, in storing, in the memory, a detection counter value equal to the unit and a value representative of the position in the electrical system of the identified electric arc.

step e) consists of storing in the memory the value of the detection counter from which a fifth determined value greater than or equal to one is subtracted.

subsequent to step d), and if the value representative of the position in the electrical system of the identified arc is comprised in the determined value interval, the method further comprises the following steps:

g) comparing a value representative of the time elapsed since the first identification of an electric arc with a determined threshold value $(t_{th})$ and, if the value representative of the time elapsed since the first identification of an electric arc is greater than or equal to the determined threshold value, h) storing in the memory the value of the detection counter from which a sixth determined value is subtracted, otherwise, the method executes step f).

an electric arc is identified in a reflectogram as soon as an amplitude value of a measured reflectogram, from which a determined reference reflectogram is subtracted, is greater than or equal to a determined threshold value.

the reflectogram is acquired by a reflectometry method of the MCTDR type (Multi Carrier Time Domain Reflectometry) meaning multi-carrier reflectometry in the time domain.

the value of the detection counter is equal to zero prior to the implementation of the steps of the method, the first determined value is equal to 1, the second determined value is between 0.3 and 0.7 meters and the fourth determined value N is between 2 and 10.

a diagnostic information representative of the presence of an electric arc is a signal adapted to be transmitted to a user via a human/machine interface and/or a data stored in a memory, adapted to be interrogated by a user.

a diagnostic information representative of the presence of an electric arc is a signal adapted to be transmitted to a disconnect system adapted to disconnect the line so as to remove the electric arc.

The invention also relates, according to a second aspect, to a unit for processing an electric arc in an electrical system, said processing unit being adapted to implement the steps of the method according to the first aspect and comprising:

means for analyzing a reflectogram representative of a spatial distribution of impedance in said electrical system and means for incrementing a detection counter by one unit;

means for comparing the value of the detection counter with a first determined value, preferably equal to the unit;

means for storing, in a memory, a value representative of the position in the electrical system of the identified electric arc;

means for comparing a value representative of the position in the electrical system of the identified electric arc with a determined value interval, said value interval preferably being equal to a value representative of the position stored in the memory of an identified electric arc plus or minus a second determined value;

means for storing, in the memory, a third determined detection counter value; and means for comparing the value of the detection counter with a fourth determined value and means for generating a diagnostic information representative of the presence of an electric arc.

The invention also relates, according to a third aspect, to an electric arc detection system comprising means adapted to acquire reflectograms representative of a spatial distribution of impedance in an electrical system, a memory and a processing unit according to the second aspect.

BRIEF DESCRIPTION OF THE FIGURES

The present invention will be better understood and further details, features and advantages of the present invention will become clearer upon reading the following non-limiting example description, with reference to the appended drawings in which.

The elements having the same functions in the various embodiments have the same references in the figures.

DETAILED DESCRIPTION OF THE INVENTION

Figure 1A:
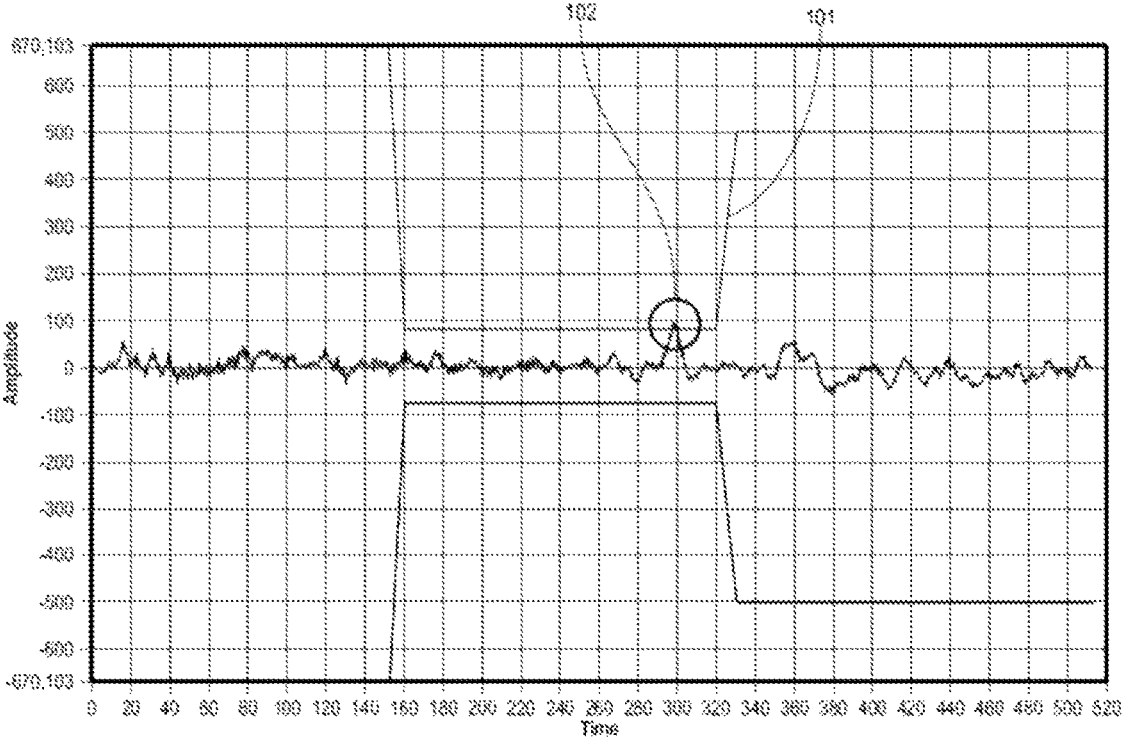
FIG. 1a is an example of a reflectogram representative of a spatial distribution of impedance in an electrical system.
Figure 1B:
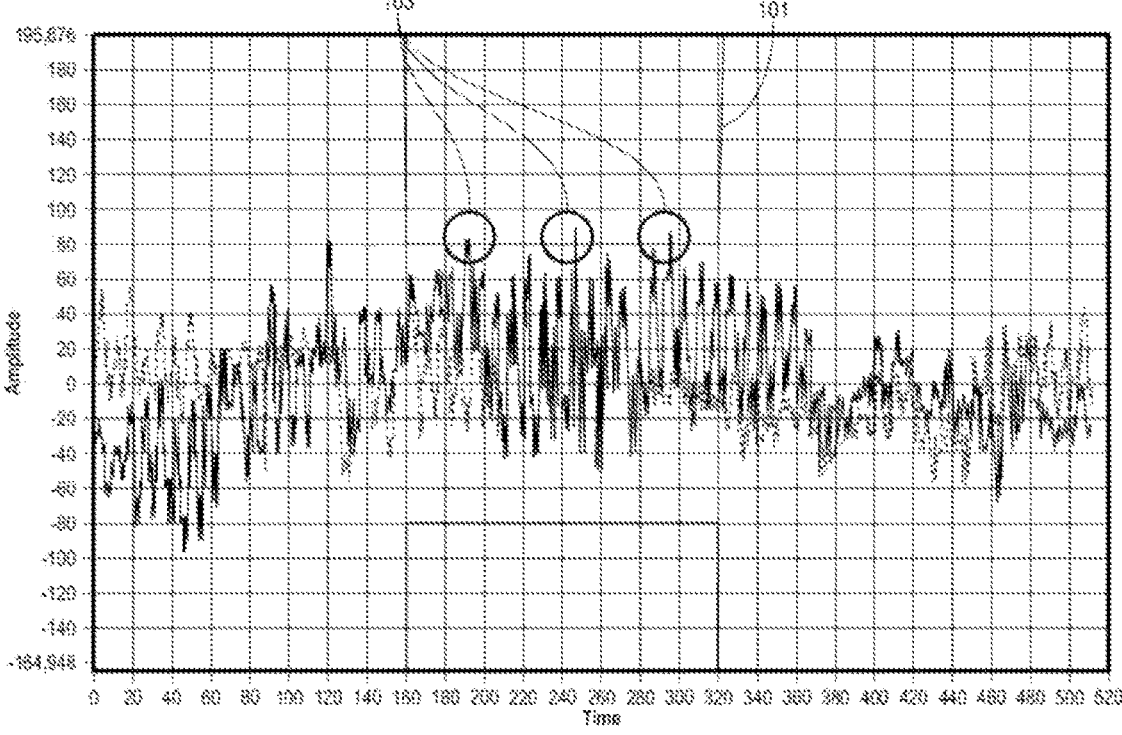
FIG. 1b is another example of a reflectogram representative of a spatial distribution of impedance in an electrical system.
Figure 2:
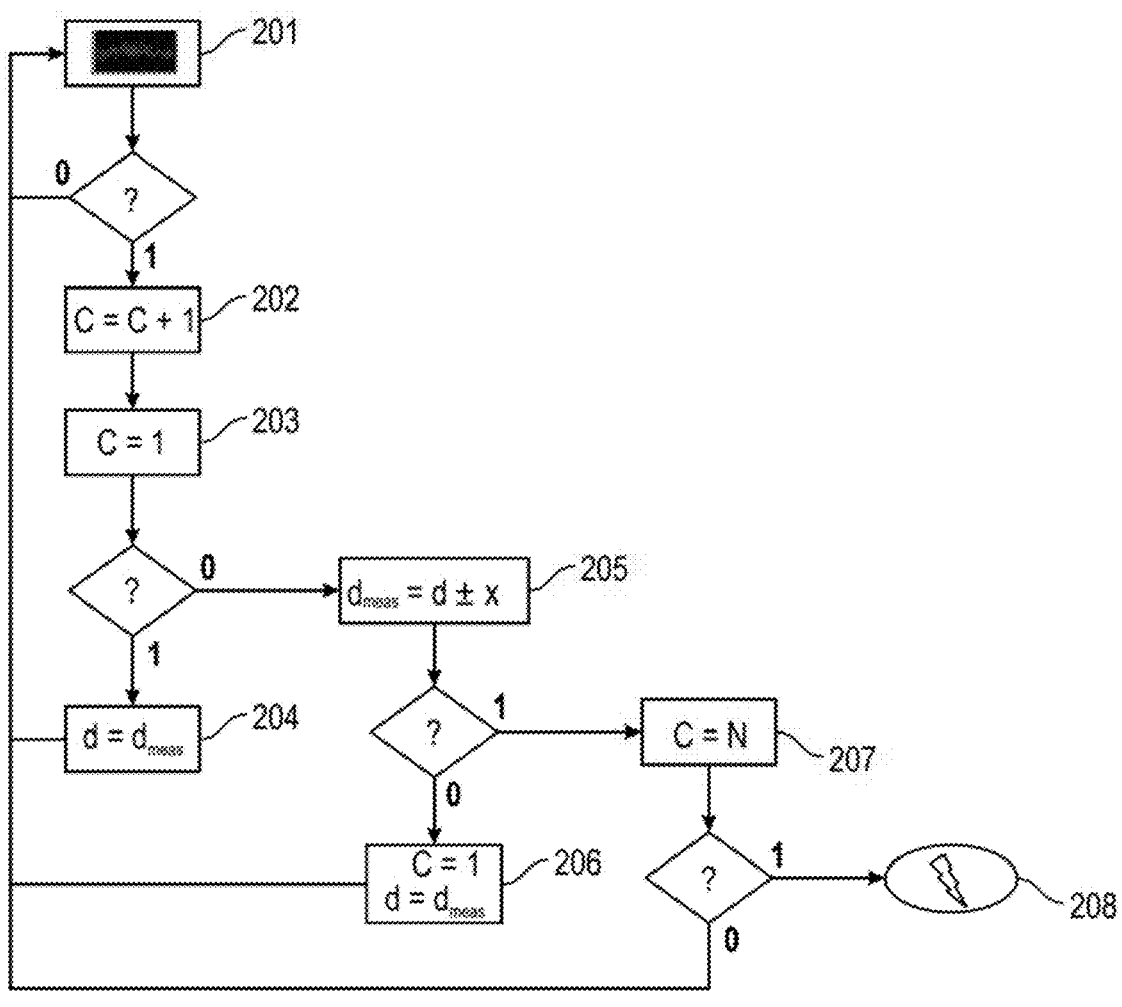
FIG. 2 is a flowchart of an embodiment of the method according to the invention.

With reference to FIG. 2, we will now describe an embodiment of the method of detecting an electric arc in an electrical system according to the invention. The electrical system may be, for example, an electrical system of an aircraft. The steps of the method are performed by a processing unit. This processing unit may, for example, belong to a system for detecting electric arcs by reflectometry which comprises, in addition to the unit, means adapted to acquire reflectograms representative of the spatial distribution of impedance in an electrical system, a memory for storing data.

The described method is based on the continuous measurement (for each iteration of the method) of the impedance variations of an electrical line. In particular, these measurements are performed by a reflectometry method which allows to obtain reflectograms representative of the spatial distribution of impedance in the measured electrical system. In a non-limiting implementation mode, each reflectogram is obtained by a reflectometry method of the MCTDR type (Multi Carrier Time Domain Reflectometry).

The difference reflectogram is the calculation of the amplitudes of the reflectogram received in real time from which are subtracted those of a reference reflectogram taken at the initialization of the diagnosis. This method thus allows to diagnose in real time the impedance evolutions related in particular to the appearance of an electric arc.

Classically, and as already described above, the diagnosis becomes positive (i.e., the presence of an electric arc is confirmed) each time the amplitude of a difference reflectogram exceeds one or several predetermined threshold values. In other words, an arc detection takes place at the location where the exceedance was observed. The principle of the method is to use several successive measurements to increase the probability that such an overshoot is indeed linked to the presence of an electric arc in the system and not to an artifact generated, for example, by noise. Indeed, in the case of noise, for example related to an environmental fault, the probability that the arc location output data is identical between several consecutive positive diagnoses is very low. In addition, the higher the number of acquisitions, the lower the probability. This ensures that an arc detection is reliable when several acquisitions confirm the same information.

The step 201 consists in the analysis of a reflectogram representative of the spatial distribution of impedance in the measured electrical system. This analysis is done by comparing the last received reflectogram to the reference reflectogram (i.e., the reference reflectogram is subtracted from each measured reflectogram). If an electric arc is identified in the reflectogram, the step 202 consists of incrementing a detection counter by one. For example, a detection counter C stored in a memory is initialized to 0 prior to the implementation of the steps of the method and has its value incremented by 1 when an arc is identified in the difference reflectogram. Furthermore, in a non-limiting implementation, an electric arc is identified in a reflectogram whenever an amplitude value of the difference reflectogram is greater than or equal to a determined threshold value.

In the step 203, the processing unit compares the value of the detection counter with a determined value, for example equal to the unit. Then, if the value of the detection counter is equal to this determined value, a value representative of the position in the electrical system of the identified electric arc is stored in a memory in step 204. In other words, the value representative of the position in the electrical system of the identified arc during the current iteration of the $d_{meas}$ method becomes the value representative of the position in the electrical system of the identified arc stored in memory d.

Otherwise, if the value of the detection counter is different from this determined value, the step 205 of the method is executed.

The step 205 comprises comparing the value representative of the position in the electrical system of the identified arc with a determined value interval. For example, this range of value may be equal to a value representative of the position of the identified arc that is stored in memory plus or minus another determined value x. Put another way, $d_{meas}$ is compared to d±x. For example, in one particular implementation, x is between 0.3 and 0.7 meters. The person skilled in the art will know how to adjust the determined value x to minimize the computation time without risking failure to detect the arc in a subsequent iteration of the method.

Thus, if the value representative of the position of the identified electric arc in the electrical system is not within the determined value range, the value assigned to the detection counter stored in memory becomes one in step 206 and the value representative of the position in the electrical system of the identified electric arc in the current iteration of the method $d_{meas}$ becomes the value representative of the position in the electrical system of the identified electric arc stored in memory d.

Alternatively, in step 207, the processing unit compares the value of the detection counter with a third determined value N and, if the value of the detection counter is equal to this third determined value, the processing unit may generate, in step 208, diagnostic information representative of the presence of an electric arc.

In a particular embodiment, the third determined value N is between 2 and 10. In fact, classically, for a typical system of electric arc detection by reflectometry, the acquisition/generation time of a reflectogram is about 1 millisecond. Thus, the method can confirm the occurrence of an electric arc after N×1 milliseconds. However, studies have shown that, particularly for an electrical system of an aircraft, the detection of an electric arc within a few milliseconds is appropriate to have a reliable measurement while detecting an arc sufficiently quickly, in particular in order to limit its harmful effects.

In particular embodiments, diagnostic information representative of the presence of an electric arc in the electrical system may be a signal adapted to be transmitted to a user via a human/machine interface, such as an audible or visual signal and/or data stored in a memory, adapted to be interrogated by a user. Thus, a user can be informed of the actual detection of an electric arc in the measured electrical system. In addition, the information in question may also include the position in the system of the detected arc if any.

In other particular embodiments, diagnostic information representative of the presence of an electric arc in the electrical system may be a signal adapted to be transmitted to a disconnect system that will then make a decision to open the line in order to stop the electric arc.

In summary, advantageously, the use of several successive acquisitions to confirm the detection of an electric arc in an electrical system allows to obtain a reliable and robust detection even when the measurements are disturbed by an electromagnetic noise.

Figure 3:
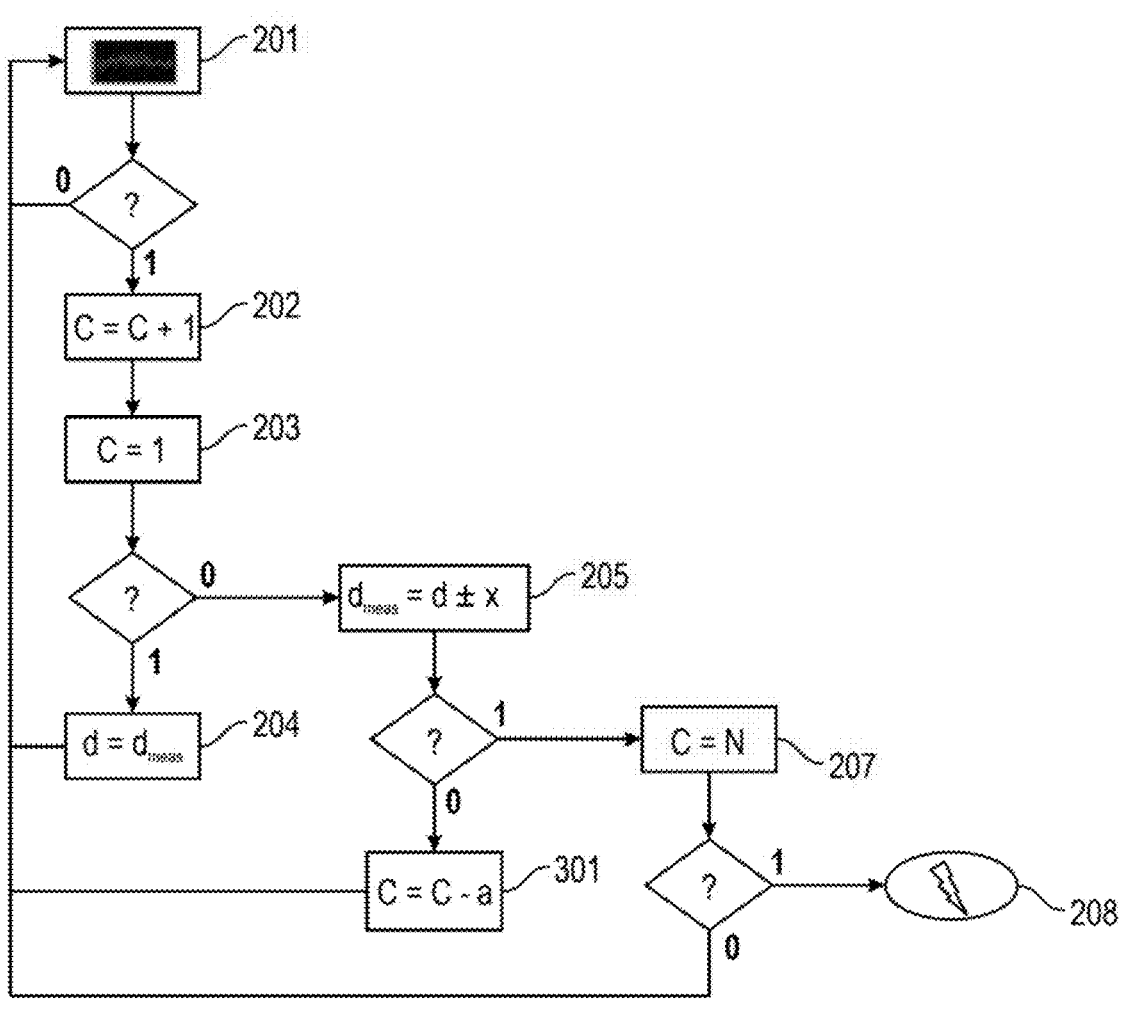
FIG. 3 is a flowchart of another embodiment of the method according to the invention.

With reference to FIG. 3, in an alternative method, in the step 301, the value of the detection counter stored in memory is its value at the time of the measurement from which a fourth determined value a is subtracted. In particular, a is a value greater than or equal to one. Thus, the counter does not necessarily fall back to one. Advantageously, in this implementation mode, the method does not necessarily require only consecutive positive diagnoses to confirm the detection of an electric arc. Thus, this mode of implementation allows more arc detections actually related to noise to be ruled out. By adjusting the determined value a, it is possible to decrement the detection counter by an optimal value allowing, on the one hand, not to lose several successive positive method iterations due to a noisy iteration and, on the other hand, to keep a method allowing a fast detection. Furthermore, the person skilled in the art will appreciate that, if the value of the detection counter is less than zero after the subtraction of a, the counter is reassigned a zero value.

Figure 4:
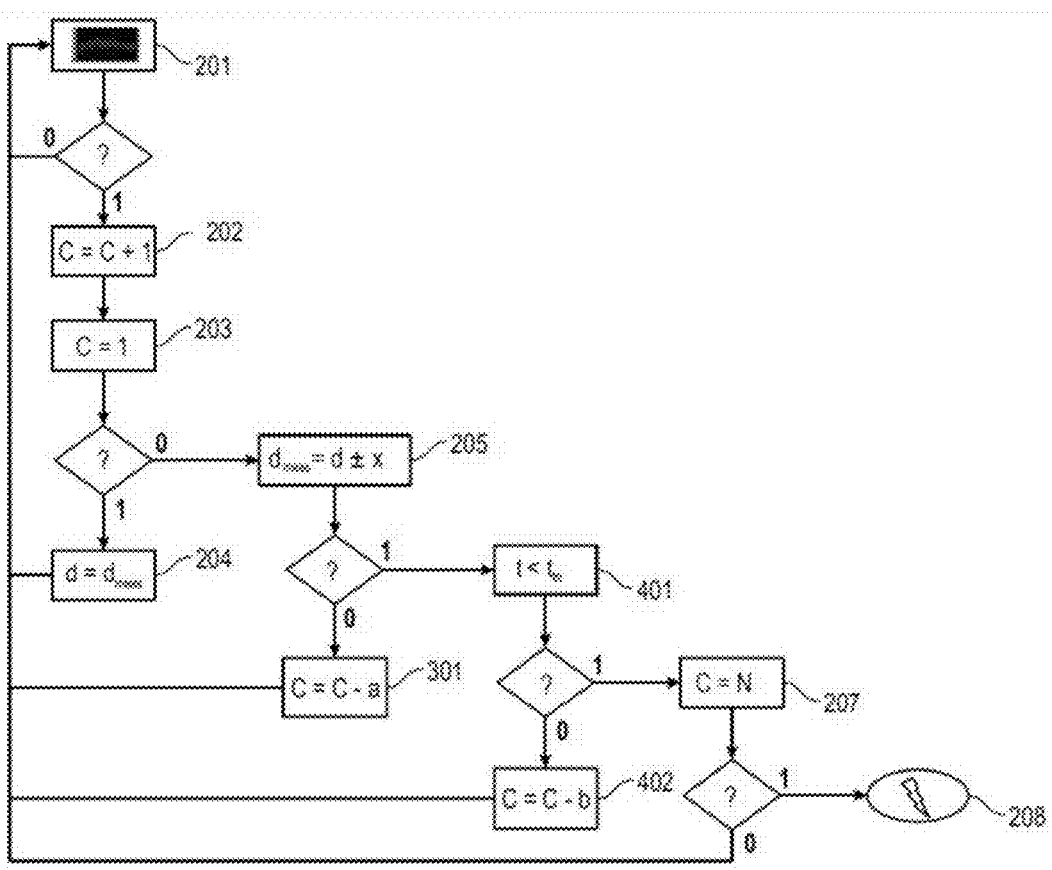
FIG. 4 is a flow diagram of an embodiment of the method according to the invention; and, FIG. 5 is a schematic representation of an embodiment of an electric arc detection system according to the invention.

Finally, with reference to FIG. 4, in another embodiment of the method, subsequent to step 205, and if the value representative of the position in the electrical system of the identified electric arc is within the determined value range, the method further comprises the following steps:

The step 401 is comparing a value representative of the time elapsed since the first identification of an electric arc with a determined threshold value $t_{th}$. Thus, if the value representative of the time elapsed since the first identification of an electric arc is greater than or equal to the threshold value $t_{th}$, the processing unit stores in the memory, in the step 402, the value of the detection counter from which is subtracted a fifth determined value b. Otherwise, the step 207, already described with reference to FIG. 2, is executed.

The threshold value $t_{th}$ thus corresponds, in other words, to a maximum time allowed for ruling on the detection of an electric arc. Thus, advantageously, this mode of implementation allows to reduce the detection counter if the time between several positive diagnoses becomes too great. Indeed, in this case, it can be considered, for example, that the defect decreases in danger as time goes by since it does not reappear. Thus, in a particular implementation, the counter C decreases by b if the time threshold value is exceeded before the counter reaches the value N. Again, the person skilled in the art will know how to adjust the value of b to select an optimal time to maintain a reliable detection method without being too long.

Figure 5:
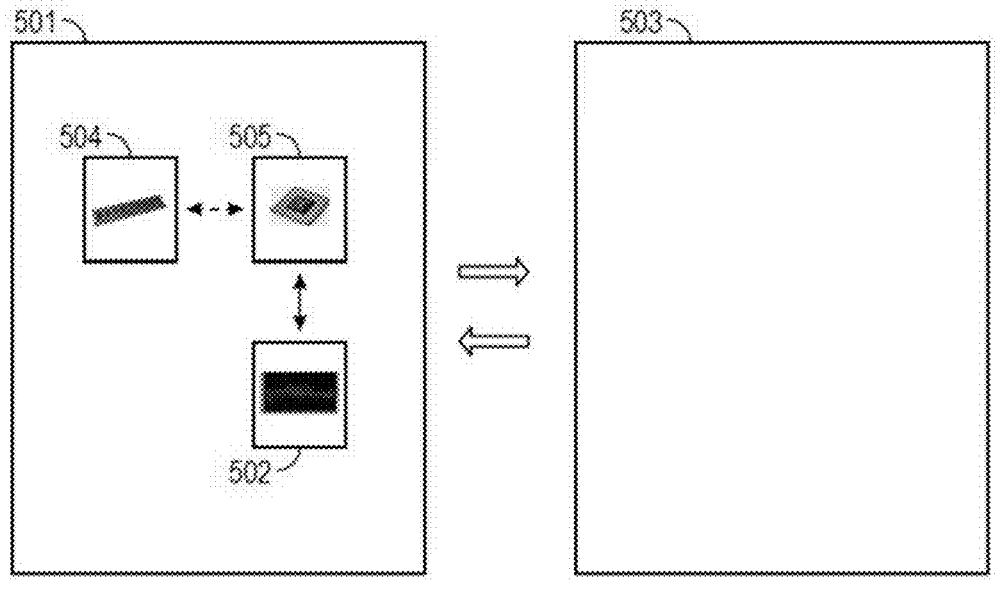

FIG. 5 shows a schematic representation of an embodiment of an arc detection system 501 comprising means 502 adapted to acquire reflectograms representative of a spatial impedance distribution in an electrical system 503, a memory 504, and a processing unit 505 adapted to perform the steps of the method described above.

The invention claimed is:

1. A method for detecting an electric arc in an electrical system, the method comprising:

analyzing a reflectogram representative of a spatial distribution of impedance in said electrical system and, when an electric arc is identified in the reflectogram, counting incrementally by one unit with a detection counter;

comparing a detection counter value with a first determined value equal to a unit of the detection counter, when the detection counter value is equal to the first determined value, storing, in a memory, a position of the identified electric arc in the electrical system, or else comparing the position of the identified arc with a determined value interval, and when the position of the identified electric arc in the electrical system is not included in the determined value interval, storing a third determined value in the memory, or else comparing the detection counter value with a fourth determined value and, when the detection counter value is equal to the fourth determined value, generating a diagnostic information representative of a presence of the electric arc.

2. The detection method according to claim 1, wherein, storing a third determined value includes, storing, in the memory, a detection counter value equal to the unit and the position in the electrical system of the identified electric arc.

3. The detection method according to claim 1, wherein, storing a third determined value includes, storing, in the memory, the detection counter value from which a fifth determined value greater than or equal to one is subtracted.

4. The detection method according to claim 1, wherein, when the position of the identified electric arc is comprised of the determined value interval, the method further comprises:

comparing a value representative of a time elapsed since the first identification of the electric arc with a determined threshold value and, when the value representative of the time elapsed since the first identification of an electric arc is greater than or equal to the determined threshold value, storing, in the memory, the detection counter value from which a sixth determined value is subtracted.

5. The detection method according to claim 1, wherein the electric arc is identified in a reflectogram as soon as an amplitude value of a measured reflectogram, from which a determined reference reflectogram is subtracted, is greater than or equal to a determined threshold value.

6. The detection method according to claim 1, wherein the reflectogram is acquired by a reflectometry method of the MCTDR (Multi Carrier Time Domain Reflectometry) type.

7. The detection method according to claim 1, wherein the value interval is equal to the position of an identified electric arc stored in memory plus or minus a second determined value.

8. The detection method according to claim 1, wherein a diagnostic information representative of the presence of the electric arc is a signal adapted to be transmitted to a user via a human/machine interface and/or a data stored in a memory, adapted to be interrogated by a user.

9. The detection method according to claim 1, wherein diagnostic information representative of the presence of the electric arc is a signal adapted to be transmitted to a disconnect system adapted to disconnect the line so as to remove the electric arc.

10. A non-transitory computer readable media storing instructions for processing an electric arc in an electrical system, that when executed by a processor circuit, causes the processor circuit to:

analyze a reflectogram representative of a spatial distribution of impedance in said electrical system and count incrementally by one unit with a detection counter;

compare a detection counter value with a first determined value;

store a position of the identified electric arc in the electrical system;

compare the position of the identified electric arc with a determined value interval;

store a third determined value; and compare the detection counter value with a fourth determined value; and generate diagnostic information representative of the presence of an electric arc.

11. An electric arc detection system comprising: means adapted to acquire reflectograms representative of a spatial distribution of impedance in an electrical system;

a processor circuit; and a memory that stores instructions, that when executed by the processor circuit, causes the processor circuit to:

analyze a reflectogram representative of a spatial distribution of impedance in said electrical system and count incrementally by one unit with a detection counter;

compare a detection counter value with a first determined value store a position of the identified electric arc in the electrical system;

compare the position of the identified electric arc with a determined value interval;

store a third determined detection counter value;

compare the detection counter with a fourth determined value; and generate diagnostic information representative of the presence of an electric arc.

12. The detection method according to claim 7, wherein, the detection counter value is equal to zero prior to the implementation of the method, the first determined value is equal to 1, the second determined value is between 0.3 and 0.7 meters and the fourth determined value is between 2 and 10.

13. The detection method according to claim 1, wherein storing a third determined value includes storing, in the memory, a detection counter value equal to the unit and a value representative of the position in the electrical system of the identified electric arc in the electrical system.

14. The detection method according to claim 1, wherein storing a third determined value includes storing, in the memory, the detection counter value from which a fifth determined value greater than or equal to one is subtracted.

15. The non-transitory computer readable media of claim 10, wherein the value interval is equal to the position of an identified electric arc stored in the memory plus or minus a second determined value.

16. The electric arc detection system of claim 11, wherein the value interval is equal to the position of an identified electric arc stored in the memory plus or minus a second determined value.

17. A method for detecting an electric arc in an electrical system, the method comprising:

analyzing a reflectogram representative of a spatial distribution of impedance in said electrical system and, when an electric arc is identified in the reflectogram, counting incrementally by one unit with a detection counter;

comparing a detection counter value with a first determined value equal to the unit of the detection counter, when the detection counter value is equal to the first determined value, storing, in a memory, a position of the identified electric arc in the electrical system which is obtained from an abscissa in time of the reflectogram, or else comparing the position of the identified arc in the electrical system with a determined value interval, and when the position of the identified electric arc in the electrical system is not included in the determined value interval, storing a third determined value in the memory, or else comparing the detection counter value with a fourth determined value and, when the detection counter value is equal to the fourth determined value, generating a diagnostic information representative of a presence of the electric arc.

* * * * *